United States Patent
Kurth et al.

(10) Patent No.: US 10,677,656 B2
(45) Date of Patent: Jun. 9, 2020

(54) DEVICES AND METHODS FOR INFRARED REFERENCE PIXELS

(71) Applicant: FLIR SYSTEMS, INC., Wilsonville, OR (US)

(72) Inventors: Eric A. Kurth, Santa Barbara, CA (US); Chris Chan, Goleta, CA (US); Kevin Peters, Goleta, CA (US); Patrick Franklin, Santa Barbara, CA (US); Robert F. Cannata, Santa Barbara, CA (US); James L. Dale, Santa Barbara, CA (US); Tommy Marx, Santa Barbara, CA (US); David Howard, Newport Beach, CA (US); Jefferson Rose, Newport Beach, CA (US); Michael DeBar, Newport Beach, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 511 days.

(21) Appl. No.: 15/465,505

(22) Filed: Mar. 21, 2017

(65) Prior Publication Data
US 2017/0191868 A1    Jul. 6, 2017

Related U.S. Application Data

(63) Continuation of application No. PCT/US2016/012760, filed on Jan. 8, 2016, and a
(Continued)

(51) Int. Cl.
*G01J 5/02* (2006.01)
*H01L 27/146* (2006.01)
(Continued)

(52) U.S. Cl.
CPC ............ *G01J 5/0245* (2013.01); *G01L 21/12* (2013.01); *H01L 25/042* (2013.01);
(Continued)

(58) Field of Classification Search
CPC .......... G01J 5/0245; G01J 5/20; G01L 21/12; H01L 25/042; H01L 27/14618; H01L 27/14623; H01L 27/14669
See application file for complete search history.

(56) References Cited

U.S. PATENT DOCUMENTS

| 4,302,674 A | 11/1981 | Adachi et al. |
| 4,463,262 A | 7/1984 | Contreras |

(Continued)

FOREIGN PATENT DOCUMENTS

| DE | 4104055 | 11/1997 |
| EP | 0481552 | 4/1992 |

(Continued)

*Primary Examiner* — David P Porta
*Assistant Examiner* — Jeremy S Valentiner
(74) *Attorney, Agent, or Firm* — Haynes and Boone LLP

(57) ABSTRACT

A device is disclosed including a substrate and a floating blinded infrared detector and/or a shunted blinded infrared detector. The floating blinded infrared detector may include an infrared detector coupled to and thermally isolated from the substrate; and a blocking structure disposed above the infrared detector to block external thermal radiation from being received by the infrared detector; and wherein the blocking structure comprises a plurality of openings. The shunted blinded infrared detector may include an additional infrared detector coupled to the substrate; an additional blocking structure disposed above the infrared detector to block external thermal radiation from being received by the additional infrared detector; and a material that thermally couples the additional infrared detector to the substrate and
(Continued)

the additional blocking structure. Methods for using and forming the device are also disclosed.

20 Claims, 14 Drawing Sheets

Related U.S. Application Data continuation-in-part of application No. 14/140,747, filed on Dec. 26, 2013, now Pat. No. 9,606,016.

(60) Provisional application No. 62/100,900, filed on Jan. 8, 2015, provisional application No. 61/798,586, filed on Mar. 15, 2013, provisional application No. 61/747,934, filed on Dec. 31, 2012.

(51) Int. Cl.
*H01L 25/04* (2014.01)
*G01M 3/38* (2006.01)
*G01L 21/12* (2006.01)
*G01J 5/06* (2006.01)
*G01M 3/34* (2006.01)
*G01J 5/20* (2006.01)
*G01J 5/00* (2006.01)
*G01M 3/00* (2006.01)

(52) U.S. Cl.
CPC .. *H01L 27/14618* (2013.01); *H01L 27/14623* (2013.01); *H01L 27/14669* (2013.01); *G01J 5/20* (2013.01); *G01J 2005/0077* (2013.01); *G01J 2005/065* (2013.01); *G01J 2005/202* (2013.01); *G01M 3/002* (2013.01); *G01M 3/34* (2013.01); *G01M 3/38* (2013.01)

(56) References Cited

U.S. PATENT DOCUMENTS

| | | | |
|---|---|---|---|
| 4,574,263 A | 3/1986 | Liddiard | |
| 4,672,206 A | 6/1987 | Suzuki et al. | |
| 4,904,090 A | 2/1990 | Oliver | |
| 5,010,251 A | 4/1991 | Grinberg et al. | |
| 5,021,663 A | 6/1991 | Hornbeck | |
| 5,134,292 A | 7/1992 | Segawa et al. | |
| 5,296,710 A | 3/1994 | Ohno et al. | |
| 5,369,280 A | 11/1994 | Liddiard | |
| 5,401,968 A | 3/1995 | Cox | |
| 5,420,419 A | 5/1995 | Wood | |
| 5,550,373 A | 8/1996 | Cole et al. | |
| 5,583,058 A | 12/1996 | Utsumi et al. | |
| 5,602,393 A | 2/1997 | Gerard | |
| 5,633,077 A | 5/1997 | Olinger | |
| 5,760,398 A | 6/1998 | Blackwell et al. | |
| 5,763,885 A | 6/1998 | Murphy et al. | |
| 5,777,329 A | 7/1998 | Westphal et al. | |
| 5,789,753 A | 8/1998 | Gooch et al. | |
| 5,831,266 A | 11/1998 | Jerominek et al. | |
| 5,952,661 A | 9/1999 | Klocek | |
| 5,962,909 A | 10/1999 | Jerominek et al. | |
| 6,020,582 A | 2/2000 | Bawolek et al. | |
| 6,028,312 A | 2/2000 | Wadsworth et al. | |
| 6,064,066 A | 5/2000 | Bevan et al. | |
| 6,094,281 A | 7/2000 | Nakai et al. | |
| 6,107,630 A | 8/2000 | Mazurowski et al. | |
| 6,249,002 B1 | 7/2001 | Butler | |
| 6,392,232 B1 | 5/2002 | Gooch et al. | |
| 6,515,285 B1 | 2/2003 | Marshall et al. | |
| 6,626,835 B1 | 9/2003 | Kraus | |
| 6,690,014 B1 | 2/2004 | Gooch et al. | |
| 7,262,412 B2 | 8/2007 | Schimert et al. | |
| 7,309,865 B2 | 12/2007 | Ikushima et al. | |
| 7,375,331 B2 | 5/2008 | Schimert et al. | |
| 7,470,904 B1 | 12/2008 | Schweikert et al. | |
| 7,579,663 B2 | 8/2009 | Wan | |
| 7,734,439 B2 | 6/2010 | Timans | |
| 7,752,742 B1 | 7/2010 | Schweikert et al. | |
| 7,795,585 B2 | 9/2010 | Sogawa et al. | |
| 7,957,926 B2 | 6/2011 | Timans | |
| 8,258,509 B2 | 9/2012 | Kimata | |
| 8,296,091 B2 | 10/2012 | Timans | |
| 8,449,177 B2 | 5/2013 | Kvisteroy et al. | |
| 8,471,206 B1 | 6/2013 | Kostrzewa et al. | |
| 8,525,323 B2 | 9/2013 | Yamazaki et al. | |
| 8,573,836 B2 | 11/2013 | Sasaki et al. | |
| 8,941,068 B2 | 1/2015 | Fendler et al. | |
| 2002/0039838 A1* | 4/2002 | Iida | G01J 5/10 438/689 |
| 2005/0077458 A1 | 4/2005 | Ma et al. | |
| 2009/0146059 A1 | 6/2009 | Nakaki | |
| 2010/0230594 A1* | 9/2010 | Honda | H01L 27/14623 250/332 |
| 2011/0266441 A1* | 11/2011 | Fagan, III | H01L 27/14625 250/332 |
| 2014/0191352 A1* | 7/2014 | Wang | H01L 27/14618 257/433 |
| 2014/0219308 A1 | 8/2014 | Kurth | |
| 2014/0267756 A1 | 9/2014 | Gousev et al. | |

FOREIGN PATENT DOCUMENTS

| | | |
|---|---|---|
| EP | 0773435 | 5/1997 |
| EP | 0836092 | 4/1998 |
| JP | 2011232157 | 11/2011 |

* cited by examiner

DEVICES AND METHODS FOR INFRARED REFERENCE PIXELS

CROSS REFERENCE TO RELATED APPLICATIONS

This application is a continuation of International Patent Application No. PCT/US2016/012760 filed Jan. 8, 2016 and entitled "DEVICES AND METHODS FOR INFRARED REFERENCE PIXELS," which is incorporated herein by reference in its entirety.

International Patent Application No. PCT/US2016/012760 filed Jan. 8, 2016 claims priority to and the benefit of U.S. Provisional Patent Application No. 62/100,900 filed Jan. 8, 2015 and entitled "DEVICES AND METHODS FOR INFRARED REFERENCE PIXELS," which is hereby incorporated by reference in its entirety.

This application claims priority as a continuation-in-part application to U.S. patent application Ser. No. 14/140,747 filed Dec. 26, 2013 and entitled "DEVICES AND METHODS FOR DETERMINING VACUUM PRESSURE LEVELS," which is hereby incorporated by reference in its entirety.

U.S. patent application Ser. No. 14/140,747 claims priority to and benefit of U.S. Provisional Patent Application No. 61/798,586 filed Mar. 15, 2013 and entitled "DEVICES AND METHODS FOR DETERMINING VACUUM PRESSURE LEVELS," which is hereby incorporated by reference in its entirety.

U.S. patent application Ser. No. 14/140,747 claims priority to and benefit of U.S. Provisional Patent Application No. 61/747,934 filed Dec. 31, 2012 and entitled "DEVICES AND METHODS FOR DETERMINING VACUUM PRESSURE LEVELS," which is hereby incorporated by reference in its entirety.

TECHNICAL FIELD

One or more embodiments of the invention relate generally to infrared detectors and, more particularly, to methods and devices for providing blind infrared detectors.

BACKGROUND

Many different types of infrared detectors typically rely on high thermal isolation from the surrounding environment to achieve a desired level of performance. For example, an infrared detector may be encapsulated within a vacuum package to minimize thermal conduction via gas molecules.

A microbolometer and a silicon-on-insulator (SOI) diode are examples of these types of infrared detectors, which may be used within infrared cameras (e.g., various types of infrared imaging devices). The microbolometer and the SOI diode are typically fabricated on monolithic silicon substrates to form an image detector array, with each infrared detector of the image detector array functioning as a pixel to produce a two-dimensional image. The change in resistance of each infrared detector is translated into a time-multiplexed electrical signal by circuitry known as the read out integrated circuit (ROIC). The combination of the ROIC and the image detector array is commonly known as a focal plane array (FPA) or infrared FPA (IRFPA).

A typical FPA is situated within a vacuum package (also known as a vacuum package assembly) to provide a high vacuum environment that is generally required to achieve a desired sensitivity from the infrared detectors. It can be difficult to measure various temperature variations within the vacuum package assembly that can negatively impact image data quality if care is not taken.

Thus, there is a need for methods and devices to measure temperature and other conditions within a vacuum package assembly, such as for a microbolometer FPA of an infrared camera.

SUMMARY

The present disclosure provides for various advantageous devices and methods, in accordance with one or more embodiments. For example, in accordance with an embodiment, a device includes a substrate and a floating blinded infrared detector that includes an infrared detector coupled to and thermally isolated from the substrate; a blocking structure disposed above the infrared detector to block external thermal radiation from being received by the infrared detector; and where the blocking structure comprises a plurality of openings.

In accordance with another embodiment, the device further includes a shunted blinded infrared detector that includes an additional infrared detector coupled to the substrate; an additional blocking structure disposed above the infrared detector to block external thermal radiation from being received by the additional infrared detector; and a material disposed beneath the additional blocking structure that thermally couples the additional infrared detector to the substrate and the additional blocking structure.

In accordance with another embodiment, the device further includes an array of further additional infrared detectors, coupled to and thermally isolated from the substrate, configured to capture infrared images.

In accordance with another embodiment, a method of generating infrared images is provided, the method including capturing infrared image data using at least one infrared detector; performing a first temperature correction to the captured infrared image data using detector reference data from a floating blinded infrared detector; and performing a second temperature correction to the captured infrared image data using substrate reference data from a shunted blinded infrared detector.

In accordance with another embodiment, a device includes a substrate, an infrared detector coupled to and thermally isolated from the substrate, and a heat shield. The heat shield is coupled to the substrate by a plurality of contacts and is disposed above the infrared detector to block external thermal radiation from being received by the infrared detector. The heat shield is configured to receive a current through the contacts to heat the heat shield to a first temperature. The infrared detector is configured to detect the first temperature and provide an output signal that is related to a vacuum pressure within the device.

In accordance with another embodiment of the present disclosure, a method of determining a vacuum pressure level within a device includes applying a current to the heat shield to heat the heat shield to a first temperature; measuring a first output signal of the infrared detector; and determining a vacuum pressure level based on the first output signal and calibration information of the infrared detector at the first temperature. The heat shield is disposed above an infrared detector to block external thermal radiation from being received by the infrared detector.

In accordance with yet another embodiment of the present disclosure, a method of forming a device includes providing a substrate; forming an infrared detector on the substrate; forming a plurality of contacts on the substrate; and forming a heat shield coupled to the plurality of contacts. The infrared detector is thermally isolated from the substrate. The heat shield is disposed above the infrared detector to block external the external radiation from being received by the infrared detector.

The scope of the disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
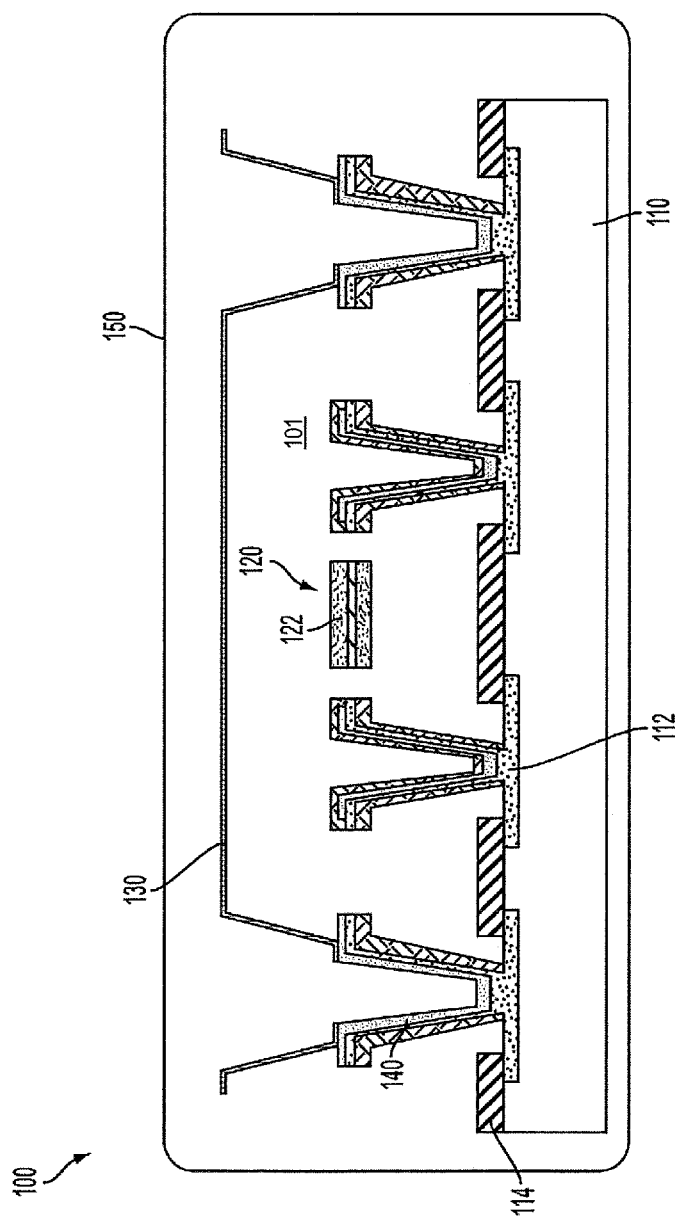
FIG. 1 illustrates a cross-sectional side view of a device having a blinded infrared detector with a blinding structure coupled to contacts for the detector in accordance with an embodiment of the present disclosure.

FIG. 1 shows a device 100 in accordance with an embodiment of the present disclosure. The device 100 includes a substrate 110, an infrared detector 120, a blinding structure 130 (sometimes referred to herein as a heat shield or a blocking structure), and contacts 140 (e.g., legs). The device 100 is encapsulated in a vacuum package 150. While FIG. 1 shows only one infrared detector 120, it should be understood that more than one infrared detector 120 may be present in the device 100 and that there may also be infrared detectors within vacuum package 150 that function as an infrared imaging array, as discussed further herein.

Substrate 110 may be formed from silicon, silicon carbide, gallium arsenide, germanium, or any other suitable material that supports integration of semiconductor devices. A metal layer 112 and overglass layer 114 are formed on substrate 110. Substrate 110 may include a ROIC that reads out the output signal (e.g., as a function of the infrared detector's resistance) as a measure of thermal radiation incident on infrared detector 120.

Infrared detector 120 is coupled to substrate 110 (e.g., via associated contacts similar to contacts 140) and includes a resistive material 122 that changes resistance in response to a change in temperature of the resistive material 122, such as vanadium oxide or amorphous silicon. Infrared detector 120 includes a support structure, e.g., legs, which thermally isolate the resistive material from substrate 110, typically by suspending it above substrate 110. Thus, infrared detector 120 is coupled to substrate 110, but is thermally isolated from substrate 110. In general, infrared detector 120 may represent a conventional infrared detector that is constructed in a conventional manner with conventional materials.

In one embodiment, infrared detector 120 is integrally fabricated along with one or more microbolometers (not shown in FIG. 1) on substrate 110. Infrared detector 120 and the microbolometers have similar structural elements that can be fabricated concurrently on the same substrate. Infrared detector 120, however, has a blinding structure 130 disposed over it that blocks external thermal radiation, while other ones of the microbolometers may form a microbolometer array to be used to capture thermal images, as would be understood by one skilled in the art.

Reference data such as temperature data relating to the infrared detector 120 and/or substrate 110 may be read out from infrared detector 120 and used to make corrections to infrared data from the microbolometers during formation of thermal images from the microbolometer data. For example, changes in signals generated by the microbolometers that are due to changes in the substrate temperature or other non-image based signals can be removed from the microbolometer signals prior to generation of a thermal image using the microbolometer signals.

In particular, according to some embodiments, an implementation of infrared detector 120 as a floating blinded infrared detector (implementation details discussed in herein below) does not substantially change its temperature in response to the incident radiation level from an external scene or the temperature of substrate 110, but does change its temperature due to self-heating (e.g., pulse bias heating) as power dissipates in response to a current flowing through it. In this regard, signals from infrared detector 120 implemented as a floating blinded infrared detector (also referred to herein as blind released infrared detector) may be used to provide reference signals or correction signals (e.g., as analog voltage or current, analog or digital data, or other appropriate forms of signal) to correct or compensate for self-heating that is occurring similarly in active bolometers (e.g., the microbolometers used for formation of thermal images). As specific examples, infrared detectors 120 implemented as floating blinded infrared detectors may be provided in a circuit to correct a bias level and/or in a circuit to provide a reference signal level to active bolometers, according to various techniques disclosed in International Patent Application No. PCT/US15/56108 filed Oct. 16, 2015 and entitled "Low Cost and High Performance Bolometer Circuitry and Methods", which is incorporated herein by reference in its entirety.

In addition, according to some embodiments, an implementation of infrared detector 120 as a shunted blinded infrared detector (implementation details discussed in herein below) does not substantially change its temperature in response to the incident radiation level from an external scene, but does track the temperature change in substrate 110. In this regard, signals from infrared detector 120 implemented as a shunted blinded infrared detector (also referred to herein as a thermally-shorted infrared detector) may be used to provide analog or digital signals or data to correct or compensate for changes in signals from active bolometers due to changes in the temperature of substrate 110. As specific examples, infrared detectors 120 implemented as shunted blinded infrared detectors may be provided as substrate temperature-compensating resistive elements in a microbolometers circuit, according to various techniques disclosed in International Patent Application No. PCT/US15/56108 previously referenced herein.

A cavity 101 may be formed between blinding structure 130 and substrate 110. Infrared detector 120, legs, contacts, or other detector structures may be formed within the cavity. In various embodiments and as discussed in further detail hereinafter, cavity 101 may be a vacuum cavity or may be filled with a material that thermally couples infrared detector 120 to substrate 110 and/or to blinding structure 130. Thus, infrared detector 120 may be a floating blinded infrared detector if cavity 101 is empty or may be a shunted blinded infrared detector if cavity 101 is filled.

In an embodiment, a blind released bolometer structure (e.g., an infrared detector having a blocking structure separated from the substrate and the detector by an empty cavity) may be described as a two layer microelectromechanical (MEM) structure. Structures formed from conventional bolometer process steps up to the end of the bolometer process, but before release or removal of the sacrificial layer used in the bolometer process, will be referred to as Layer 1. Layer 1 is coated with another layer of sacrificial material (release material #2). This release material is patterned such that no release material #2 will remain above contact points in Layer 1 when removed. The contact points in Layer 1 can be but are not limited to: ROIC to bolometer (BOLO) contacts; contacts formed the same as ROIC to BOLO contacts but having no bolometer (bridge, legs, etc.), openings down through release material #1 down to the surface of the ROIC, etc. A layer of blinding (blocking) material will be patterned to: (1) Remove the material from active MEM structures (non-blind bolometers); (2) Add features such as openings that can assist in the release process; and (3) Add features such as insulating coatings that can assist the physical robustness of the blocking material. After the blocking material is patterned (e.g., either by etch or lift-off), the removal of the sacrificial material can be done. Because both sacrificial layers (release material #1 and #2) will be exposed to the release process during this step, all release material will be removed from the product leaving two layers of structures: Layer 1 (bolometer structures such as infrared detector 120 and associated contacts and legs) and Layer 2 (blocking structures such as blinding structure 130).

Figure 2:
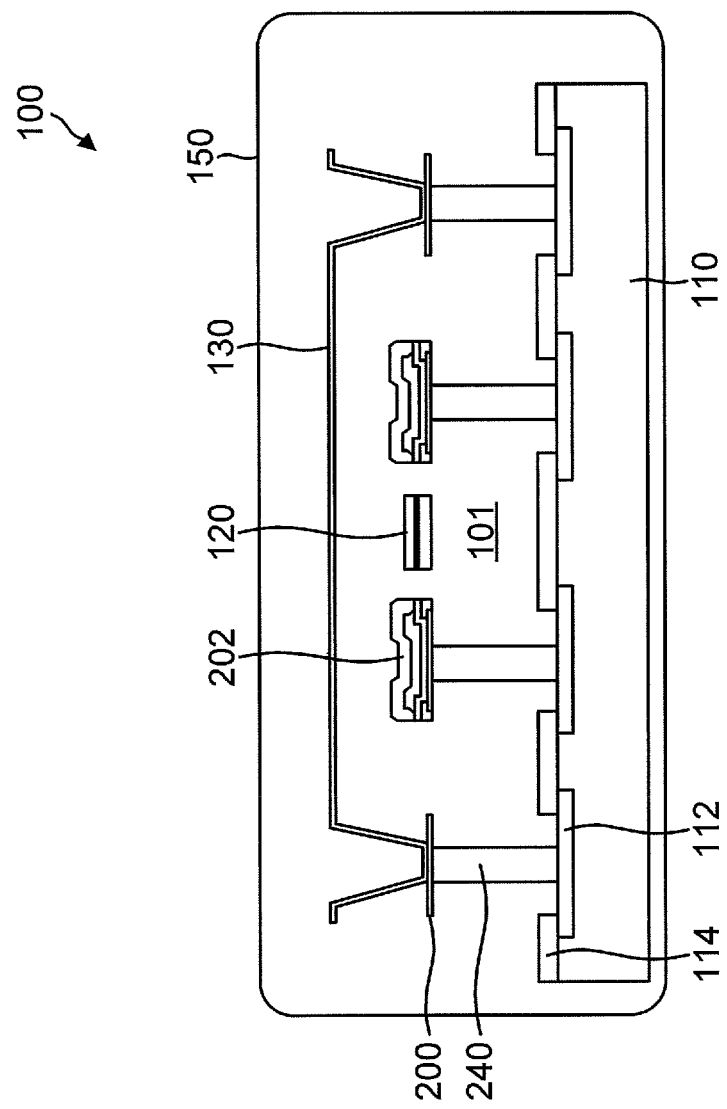
FIG. 2 illustrates a cross-sectional side view of a device having a blinded infrared detector with a blinding structure coupled to stud contacts for the detector in accordance with an embodiment of the present disclosure.

Contacts 140 may form basket-shaped contacts with legs that are formed on substrate 110 to contact metal layer 112 as in FIG. 1 or may form stud contacts 240 that extend from the substrate up to bolometer contacts such as legs as shown, for example in FIG. 2. As shown in FIG. 2, in embodiments with stud contacts 240, an etch stop layer 200 may be formed at the top of the stud structure and additional contact layers 202 may be formed above the etch stop layer for stud contacts 240 that are coupled to infrared detector 120. In various embodiments, contacts 140 and/or 240 may be fabricated according to the methods and materials described in U.S. patent application Ser. No. 12/576,971, which is incorporated in its entirety by reference herein. Contacts 140 and/or 240, however, may represent various types of conventional contacts as would be known by one skilled in the art.

Figure 3:
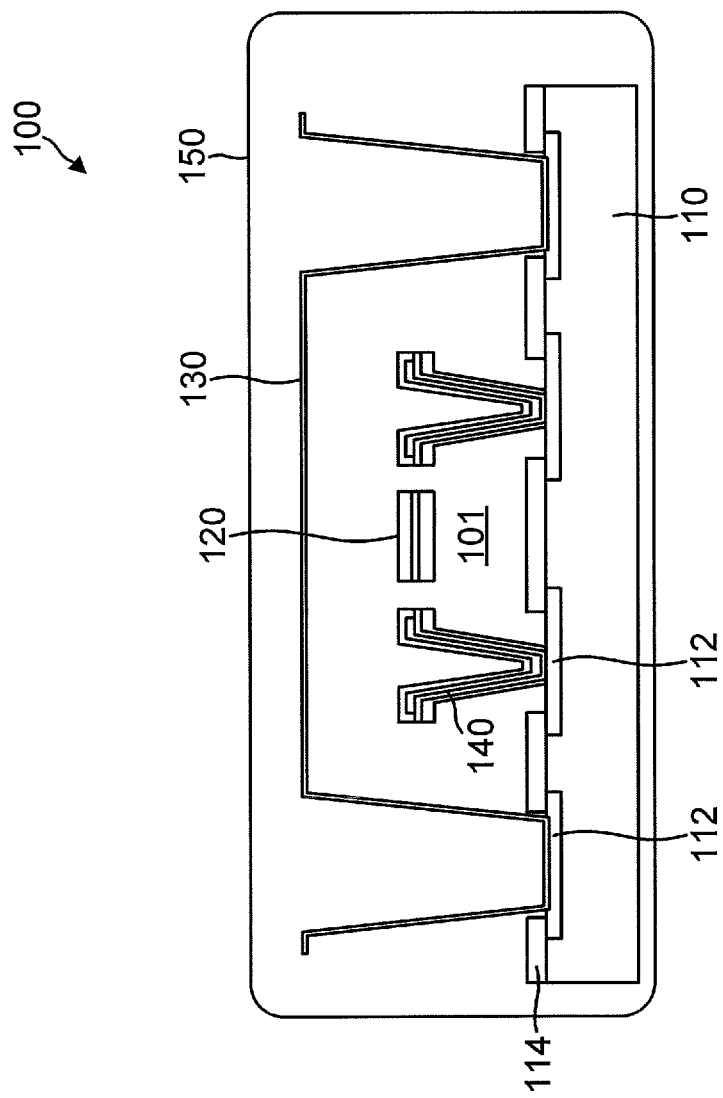
FIG. 3 illustrates a cross-sectional side view of a device having a blinded infrared detector having contacts for the detector and a blinding structure coupled to conductive contacts on a device substrate in accordance with an embodiment of the present disclosure.
Figure 4:
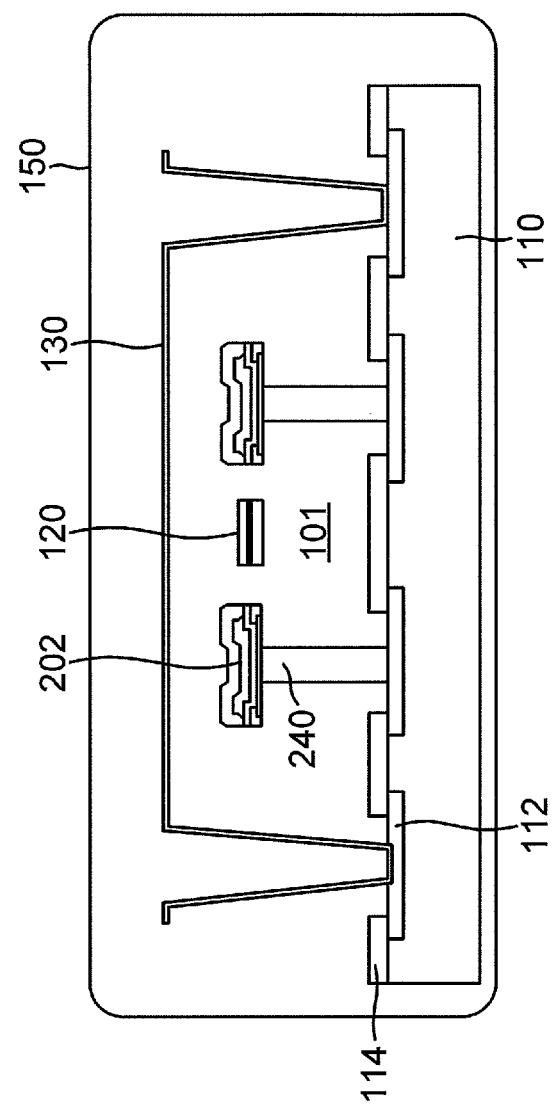
FIG. 4 illustrates a cross-sectional side view of a device having a blinded infrared detector having stud contacts for the detector and a blinding structure coupled to conductive contacts on a device substrate in accordance with an embodiment of the present disclosure.

The examples of FIGS. 1 and 2 in which blinding structure 130 is coupled to substrate 110 (e.g., to metal contacts of the metal layers 112 of substrate 110) via contacts 140 and 240 are merely illustrative. As shown in FIGS. 3 and 4 respectively, whether basket contacts, stud contacts or other contacts are used to couple infrared detector 120 to substrate 110, blinding structure 130 may extend directly to metal contacts of the metal layers 112 formed on and/or within substrate 110.

Figure 5:
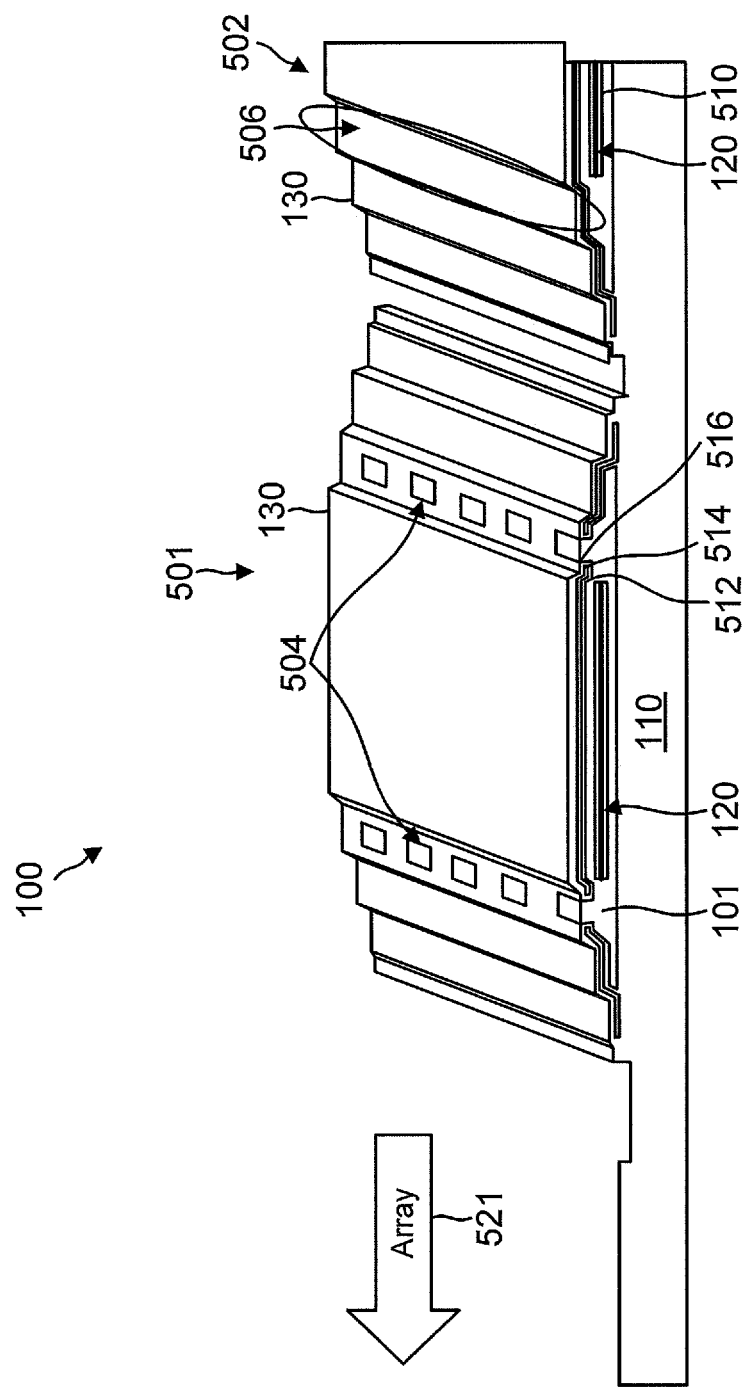
FIG. 5 illustrates a perspective view of a device having a floating blinded infrared detector and a shunted blinded infrared detector in accordance with an embodiment of the present disclosure.

As previously discussed, cavity 101 may be empty (for floating blinded infrared detectors) or may be filled (for shunted blinded infrared detectors). FIG. 5 is a perspective view of a device 100 implemented with both a floating blinded infrared detector 501 and a shunted blinded infrared detector 502. As shown in FIG. 5, blinding structure 130 of floating blinded infrared detector 501 may have openings 504 that allow release materials to pass through openings 504 into cavity 101 to remove sacrificial material within cavity 101, thereby releasing infrared detector 120 and blinding structure 130 of floating blinded infrared detector 501. In this way, floating blinded infrared detector 501 may be provided with an infrared detector that is thermally isolated from substrate 110 and blinding structure 130. Openings 504 may be sufficiently small to block infrared radiation (e.g., infrared light having wavelengths between about 8 microns and 14 microns) from reaching infrared detector 120.

As shown in FIG. 5, blinding structure 130 of floating blinded infrared detector 501 may be formed from multiple layers such as a first insulating layer 512 (e.g., silicon dioxide or silicon nitride), a metal layer 514, and a second insulating layer 516. Metal layer 514 may block infrared radiation from reaching infrared detector 120. Insulating layers 512 and 516 may help prevent removal of metal layer 514 during removal of the sacrificial material in cavity 101.

As shown in FIG. 5, the region 506 of the blinding structure 130 of shunted blinded infrared detector 502 that corresponds to the region of blinding structure 130 of floating blinded infrared detector 501 that has openings may be provided without any openings so that sacrificial material 510 remains in the cavity formed around infrared detector 120 for the shunted blinded infrared detector. Sacrificial material 510 may therefore remain in a working device and may thermally couple the infrared detector 120 of each shunted blinded infrared detector 502 to the substrate 110 so that that infrared detector 120 measures changes in the temperature of the substrate.

As indicated by arrow 521, additional infrared detectors such as an array of microbolometers for infrared imaging may also be provided on substrate 110.

Blinding structure 130 is disposed above infrared detector 120 to block incident or external thermal radiation from being received by infrared detector 120. Blinding structure 130 is placed in a spaced relationship (e.g., spaced adjacent relationship) and in proximity to infrared detector 120 to minimize or block external thermal radiation. Any suitable distance may be employed for blocking external or undesired thermal radiation from reaching infrared detector 120.

Figure 6:
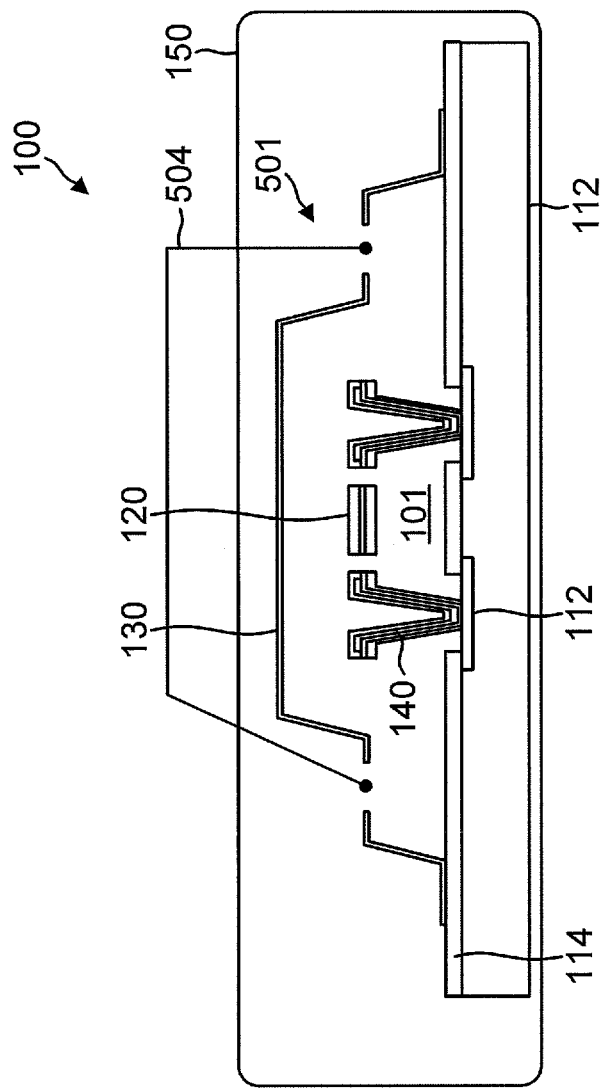
FIG. 6 illustrates a cross-sectional side view of a device having a floating blinded infrared detector having basket contacts for the detector and showing how a blinding structure for the blinded infrared detector may include openings for releasing the blinding structure in accordance with an embodiment of the present disclosure.
Figure 7:
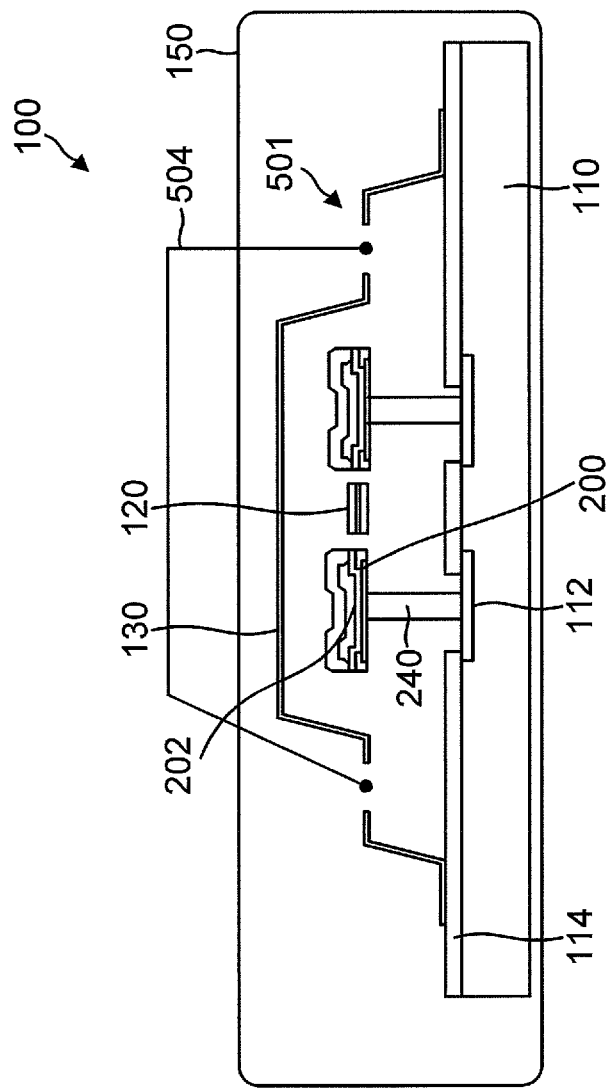
FIG. 7 illustrates a cross-sectional side view of a device having a floating blinded infrared detector having stud contacts for the detector and showing how a blinding structure for the blinded infrared detector may include openings for releasing the blinding structure in accordance with an embodiment of the present disclosure.

FIGS. 6 and 7 are cross-sectional views of device 100 with the cross section taken at the location of two of openings 504 of a floating blinded infrared detector 501 for devices with basket contacts and stud contacts respectively. Sacrificial material upon which blinding structure 130 of floating blinded infrared detector 501 was formed has been removed through openings 504.

Figure 8:
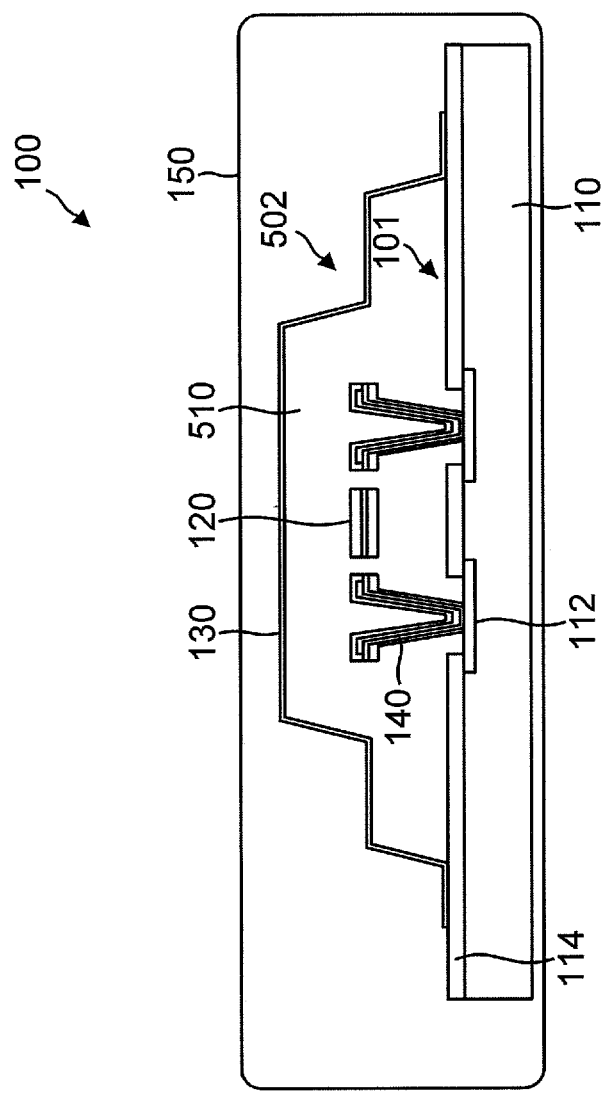
FIG. 8 illustrates a cross-sectional side view of a device having a shunted blinded infrared detector having basket contacts for the detector in accordance with an embodiment of the present disclosure.
Figure 9:
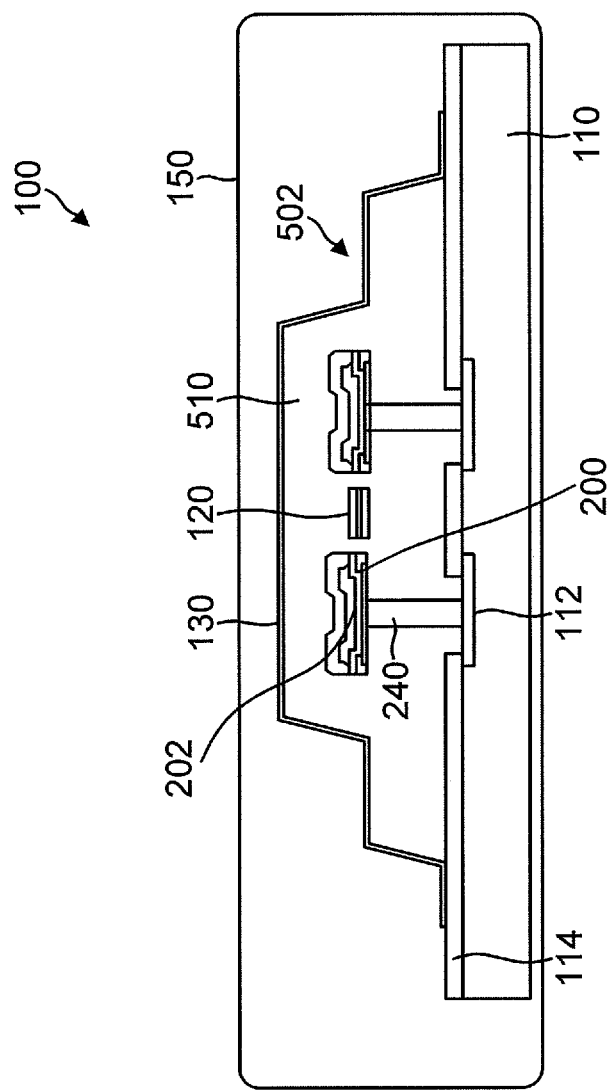
FIG. 9 illustrates a cross-sectional side view of a device having a shunted blinded infrared detector having stud contacts for the detector in accordance with an embodiment of the present disclosure.

FIGS. 8 and 9 are cross-sectional views of device 100 with a shunted infrared detector 502 for devices with basket contacts and stud contacts respectively and showing how sacrificial material 510 may remain and substantially fill the cavity 101 in which detector 120 and the contacts are formed.

In one embodiment, blinding structure 130 may include a metallic reflective layer, for example, an optical blocking metallization layer such as gold-platinum-titanium (Au—Pt—Ti), although alternative metallization layers, e.g., gold-palladium-titanium (Au/Pd/Ti), gold-nickel-titanium (Au/Ni/Ti), aluminum, aluminum-titanium (Al/Ti), nickel chromium, vanadium oxide, etc. are also suitable. Blocking materials may be applied using any suitable method, e.g., evaporation, sputtering, plating, etc.

Figure 10:
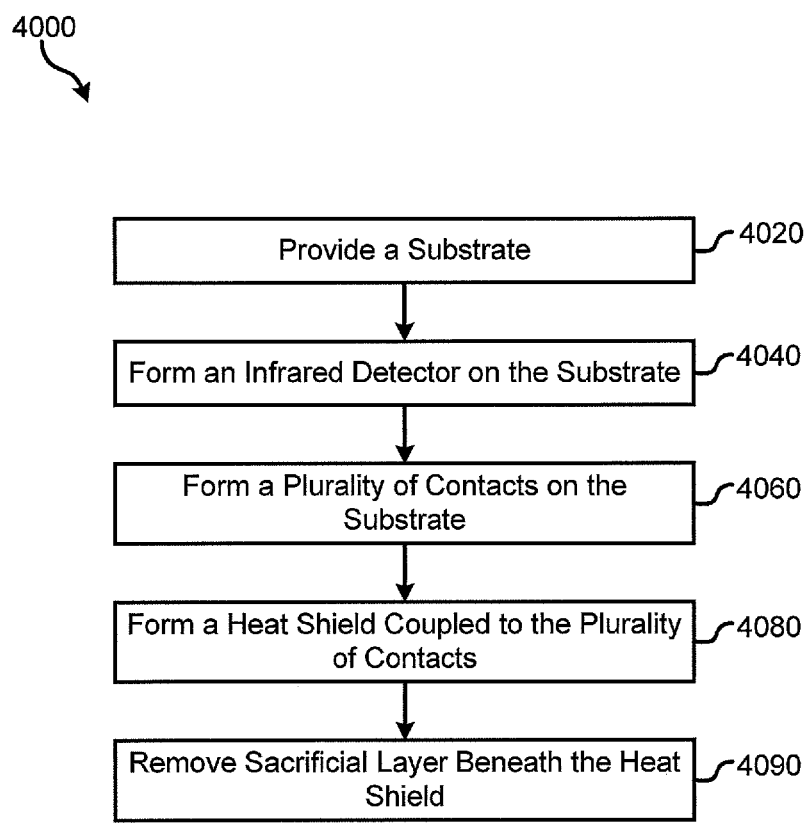
FIG. 10 illustrates a flowchart showing a method of forming a device in accordance with embodiments of the present disclosure.

In accordance with an embodiment, FIG. 10 shows a flow diagram illustrating a method 4000 for forming the device 100. At block 4020, a substrate 110 is provided. At block 4040, an infrared detector 120 is formed on substrate 110 using conventional methods known by those skilled in the art. At block 4060, a plurality of contacts such as contacts 140 and/or 240 are formed on substrate 110 using conventional methods known by those skilled in the art. At block 4080, a blinding structure 130 such as a heat shield is coupled to the substrate (e.g., via the plurality of contacts or directly) so that blinding structure 130 is disposed above infrared detector 120 to block external thermal radiation from being received by infrared detector 120. Forming the blocking structure may include depositing a sacrificial material over the infrared detector and the substrate, forming an insulating layer over the sacrificial material, forming a metal layer over the insulating layer, forming an additional insulating layer over the metal layer, and forming openings in the blocking structure. At block 4090, one or more sacrificial layers disposed beneath the blocking structure may be removed (e.g., by passing an etchant through the openings in the blocking structure and removing the sacrificial layers through the openings).

Figure 11:
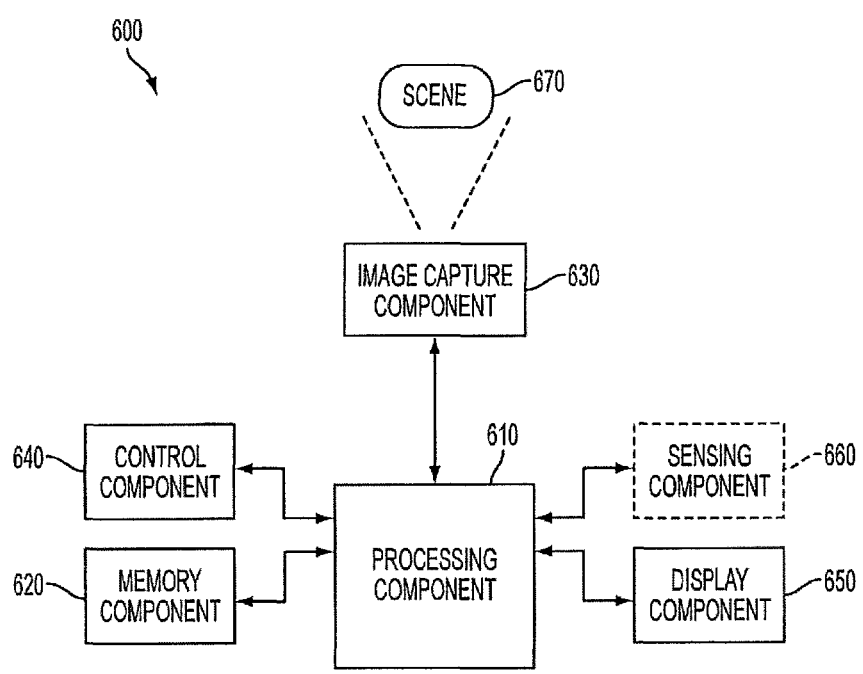
FIG. 11 illustrates a block diagram of a system for capturing images in accordance with an embodiment of the present disclosure.

In accordance with one or more embodiments, the devices and methods described herein may be performed on a vacuum package assembly, such as within an infrared camera. For example, FIG. 11 shows a block diagram illustrating a system 600 (e.g., an infrared camera, including any type of infrared imaging system) for capturing images and processing in accordance with one or more embodiments. System 600 comprises, in one implementation, a processing component 610, a memory component 620, an image capture component 630, a control component 640, and/or a display component 650. System 600 may further include a sensing component 660.

System 600 may represent for example an infrared imaging device to capture and process images, such as video images of a scene 670. The system 600 may represent any type of infrared camera adapted to detect infrared radiation and provide representative data and information (e.g., infrared image data of a scene) or may represent more generally any type of electro-optical sensor system. In one example, system 600 may represent an infrared camera, a dual band imager such as a night vision imager that operates to sense reflected visible and/or SWIR light for high resolution images and LWIR radiation for thermal imaging, or an imager for sensing both short wave and long wave radiation simultaneously for providing independent image information. System 600 may comprise a portable device and may be incorporated, e.g., into a vehicle (e.g., an automobile or other type of land-based vehicle, an aircraft, a marine craft, or a spacecraft) or a non-mobile installation requiring infrared images to be stored and/or displayed and may comprise a distributed networked system.

In various embodiments, processing component 610 may comprise any type of a processor or a logic device (e.g., a programmable logic device (PLD) configured to perform processing functions). Processing component 610 may be adapted to interface and communicate with components 620, 630, 640, and 650 to perform method and processing steps and/or operations, as described herein, including conventional system processing functions as would be understood by one skilled in the art.

Memory component 620 comprises, in one embodiment, one or more memory devices adapted to store data and information, including for example infrared data and information. Memory device 620 may comprise one or more various types of memory devices including volatile and non-volatile memory devices, and/or a machine-readable medium capable of storing data in a machine-readable format. Processing component 610 may be adapted to execute software stored in memory component 620 so as to perform method and process steps and/or operations described herein.

Image capture component 630 comprises, in one embodiment, any type of image sensor, such as for example one or more infrared sensors (e.g., any type of multi-pixel infrared detector, such as microbolometer detectors and focal plane arrays) for capturing infrared image data (e.g., still image data and/or video data) representative of an image, such as scene 670. For example, for an embodiment, image capture component 630 may include an array of microbolometers that form an infrared imaging array and further include one or more infrared detectors 120 with blinding structures 130 that form floating blinded infrared detectors and/or shunted blinded infrared detectors for monitoring various temperature variations of image capture component 630 that can affect imaging operations.

In one implementation, the infrared sensors of image capture component 630 provide for representing (e.g., converting) the captured image data as digital data (e.g., via an analog-to-digital converter included as part of the infrared sensor or separate from the infrared sensor as part of system 700). In one aspect, the infrared image data (e.g., infrared video data) may comprise non-uniform data (e.g., real image data) of an image, such as scene 670. Processing component 610 may be adapted to process the infrared image data and/or reference data (e.g., to provide processed image data), store the infrared image data and/or reference data in memory component 620, and/or retrieve stored infrared image data and/or reference data from memory component 620. For example, processing component 610 may be adapted to process infrared image data and/or reference data stored in memory component 620 to provide processed image data and information (e.g., captured and/or processed infrared image data).

Control component 640 comprises, in one embodiment, a user input and/or interface device. For example, the user input and/or interface device may represent a rotatable knob (e.g., potentiometer), push buttons, slide bar, touch screen, keyboard, etc., that is adapted to generate a user input control signal. Processing component 610 may be adapted to sense control input signals from a user via control component 640 and respond to any sensed control input signals received therefrom. Processing component 610 may be adapted to interpret such a control input signal as a parameter value, as generally understood by one skilled in the art.

In one embodiment, control component 640 may comprise a control unit (e.g., a wired or wireless handheld control unit) having push buttons adapted to interface with a user and receive user input control values. In one implementation, the push buttons of the control unit may be used to control various functions of the system 600, such as autofocus, menu enable and selection, field of view, brightness, contrast, noise filtering, high pass filtering, low pass filtering, and/or various other features as understood by one skilled in the art.

Display component 650 comprises, in one embodiment, an image display device (e.g., a liquid crystal display (LCD) or various other types of generally known video displays or monitors, including touch screen displays). Processing component 610 may be adapted to display image data and information on the display component 650. Processing component 610 may be adapted to retrieve image data and information from memory component 620 and display any retrieved image data and information on display component 650. Display component 650 may comprise display electronics, which may be utilized by processing component 610 to display image data and information (e.g., infrared images). Display component 650 may be adapted to receive image data and information directly from image capture component 630 via the processing component 610, or the image data and information may be transferred from memory component 620 via processing component 610.

Sensing component 660 comprises, in one embodiment, one or more sensors of various types, depending on the application or implementation requirements, as would be understood by one skilled in the art. The sensors of optional sensing component 660 provide data and/or information to at least processing component 610. In one aspect, processing component 610 may be adapted to communicate with sensing component 660 (e.g., by receiving sensor information from sensing component 660) and with image capture component 630 (e.g., by receiving data and information from image capture component 630 and providing and/or receiving command, control, and/or other information to and/or from one or more other components of system 600).

In various implementations, sensing component 660 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 660 may represent conventional sensors as generally known by one skilled in the art for monitoring various conditions (e.g., environmental conditions) that may have an effect (e.g., on the image appearance) on the data provided by image capture component 630.

In some implementations, optional sensing component 660 (e.g., one or more of sensors) may comprise devices that relay information to processing component 610 via wired and/or wireless communication. For example, optional sensing component 660 may be adapted to receive information from a satellite, through a local broadcast (e.g., RF) transmission, through a mobile or cellular network and/or through information beacons in an infrastructure (e.g., a transportation or highway information beacon infrastructure), or various other wired and/or wireless techniques.

In various embodiments, components of system 600 may be combined and/or implemented or not, as desired or depending on the application or requirements, with system 600 representing various functional blocks of a related system. In one example, processing component 610 may be combined with memory component 620, image capture component 630, display component 650, and/or optional sensing component 660. In another example, processing component 610 may be combined with image capture component 630 with only certain functions of processing component 610 performed by circuitry (e.g., a processor, a microprocessor, a logic device, a microcontroller, etc.) within image capture component 630. Furthermore, various components of system 600 may be remote from each other (e.g., image capture component 630 may comprise a remote sensor with processing component 610, etc. representing a computer that may or may not be in communication with image capture component 630).

Figure 12:
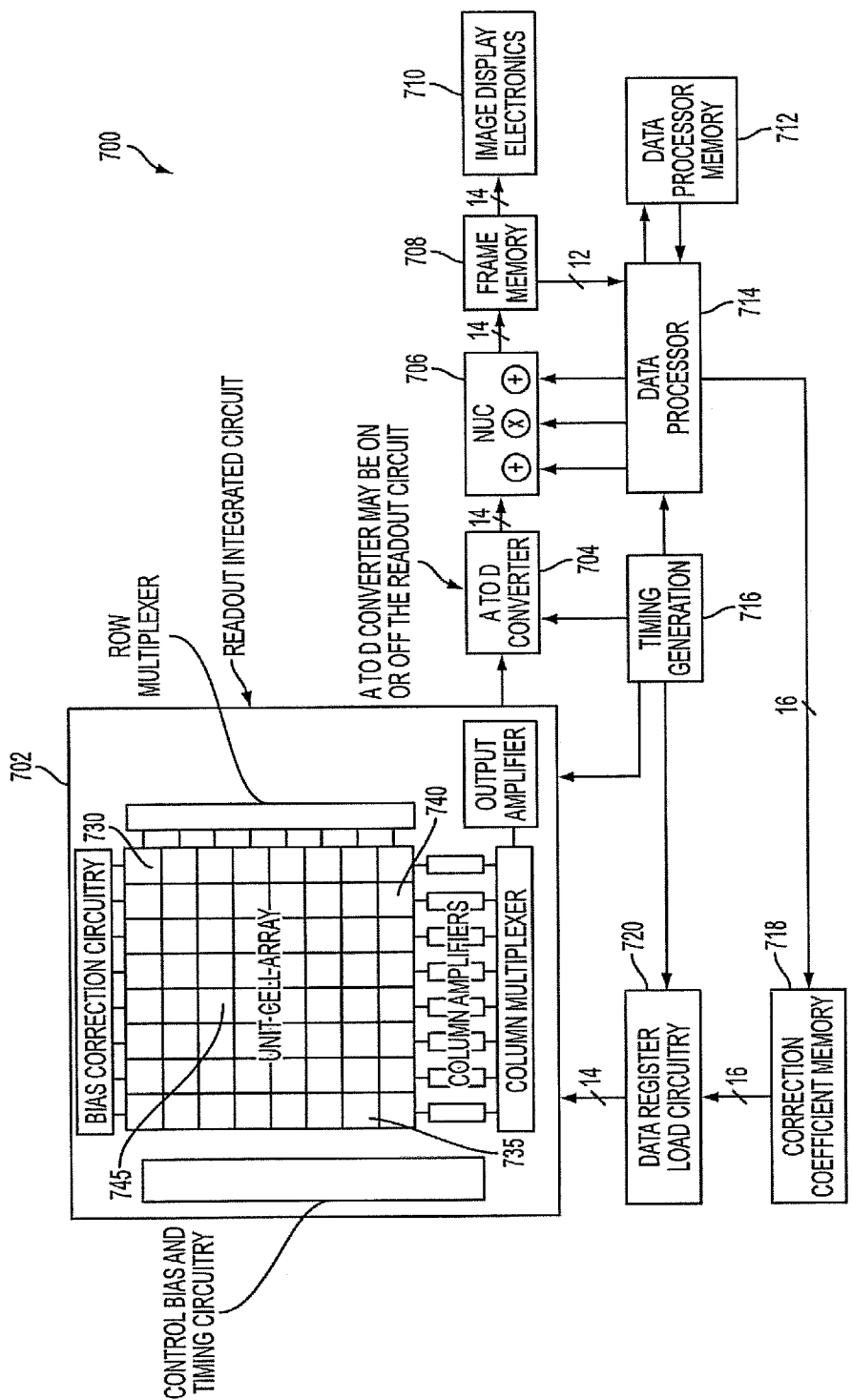
FIG. 12 illustrates a block diagram illustrating an infrared camera in accordance with one or more embodiments of the present disclosure.

FIG. 12 shows a block diagram illustrating a specific implementation example for an infrared camera 700 in accordance with one or more embodiments. Infrared camera 700 may represent a specific implementation of system 600 (FIG. 11), as would be understood by one skilled in the art.

Infrared camera 700 (e.g., a microbolometer array having a readout integrated circuit with bias-correction circuitry and interface system electronics) includes a readout integrated circuit (ROIC) 702, which may include the microbolometer array (e.g., unit cell array) having a plurality of contacts, control circuitry, timing circuitry, bias circuitry, row and column addressing circuitry, column amplifiers, and associated electronics to provide output signals that are digitized by an analog-to-digital (A/D) converter 704. The A/D converter 704 may be located as part of or separate from ROIC 702.

As shown, the microbolometer unit cell array includes a plurality of infrared detectors (e.g., in this example, microbolometers), including infrared detectors 730, 735, 740, and 745 as disclosed herein. One or more of infrared detectors 730, 735, 740, and 745 may include blinding structures 130 as set forth herein so as to form floating and/or shunted blinded infrared detectors within the vacuum package assembly containing ROIC 702 in accordance with the techniques disclosed herein. Various other infrared detectors may be provided without blinding structures 130 and coupled to the unit cell array for capturing of image data.

It should be understood that floating blinded infrared detectors and shunted blinded infrared detectors may be made and/or operated in the same way (e.g., same materials and semiconductor manufacturing processes) as the infrared detectors of the array that will be used for infrared imaging.

The output signals from A/D converter 704 are adjusted by a non-uniformity correction circuit (NUC) 706, which applies temperature dependent compensation as would be understood by one skilled in the art. After processing by NUC 706, the output signals are stored in a frame memory 708. The data in frame memory 708 is then available to image display electronics 710 and a data processor 714, which may also have a data processor memory 712. A timing generator 716 provides system timing.

Data processor 714 generates bias-correction data words, which are loaded into a correction coefficient memory 718. A data register load circuit 720 provides the interface to load the correction data into ROIC 702. In this fashion, variable circuitry such as variable resistors, digital-to-analog converters, biasing circuitry, which control voltage levels, biasing, frame timing, circuit element values, etc., are controlled by data processor 714 so that the output signals from ROIC 702 are uniform over a wide temperature range.

It should be understood that various functional blocks of infrared camera 700 may be combined and various functional blocks may also not be necessary, depending upon a specific application and specific requirements. For example, data processor 714 may perform various functions of NUC 706, while various memory blocks, such as correction coefficient memory 718 and frame memory 708, may be combined as desired.

Figure 13:
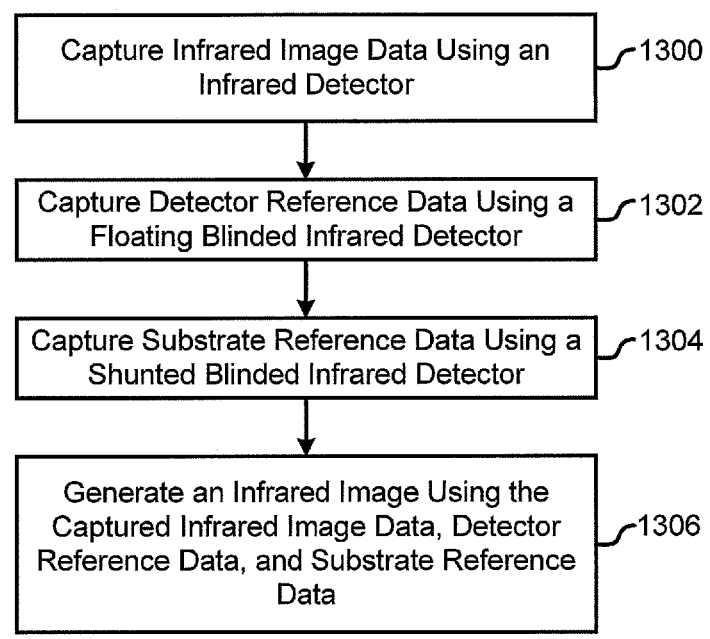
FIG. 13 illustrates a flowchart showing a method of operating a device in accordance with embodiments of the present disclosure.

In accordance with an embodiment, FIG. 13 shows a flow diagram illustrating a method for operating the device 100. At block 1300, infrared image data may be captured using an infrared image detector (e.g., a microbolometer of an array of microbolometers in a vacuum package assembly). At block 1302, detector reference data may be captured using a floating blinded infrared detector such as detector 501 of FIG. 5. The detector reference data may include temperature information or other information associated with the floating blinded infrared detector that includes information regarding relatively small changes in temperature of the microbolometers used to capture image data because the thermal and readout characteristics of the floating blinded infrared detector are the same as an active bolometer only the floating blinded infrared detector is optically blinded to the incoming radiance. Thus, according to some embodiments, the detector reference data (e.g., analog or digital signals or data, or in other suitable form) may be used to perform a temperature correction to correct or compensate for at least some effects of self-heating on the infrared image data captured by the infrared image detector, as discussed above with reference to FIG. 1. At block 1304, substrate reference data may be captured using a shunted blinded infrared detector. The substrate reference data may include temperature information for the substrate on which the detectors are formed due to a thermal coupling between the substrate and the shunted blinded infrared detector by a material formed underneath a blinding structure for the shunted blinded infrared detector. Thus, according to some embodiments, the substrate reference data (e.g., analog or digital signals or data, or in other suitable form) may be used to perform a temperature correction to correct or compensate for at least some effects of the temperature of the substrate on the infrared image data captured by the infrared image detector, as discussed above with reference to FIG. 1. At block 1306, an infrared image may be generated using the captured infrared image data, detector reference data, and substrate reference data (e.g., by removing temperature variations in the detector reference data and substrate reference data from the infrared image data).

Figure 14:
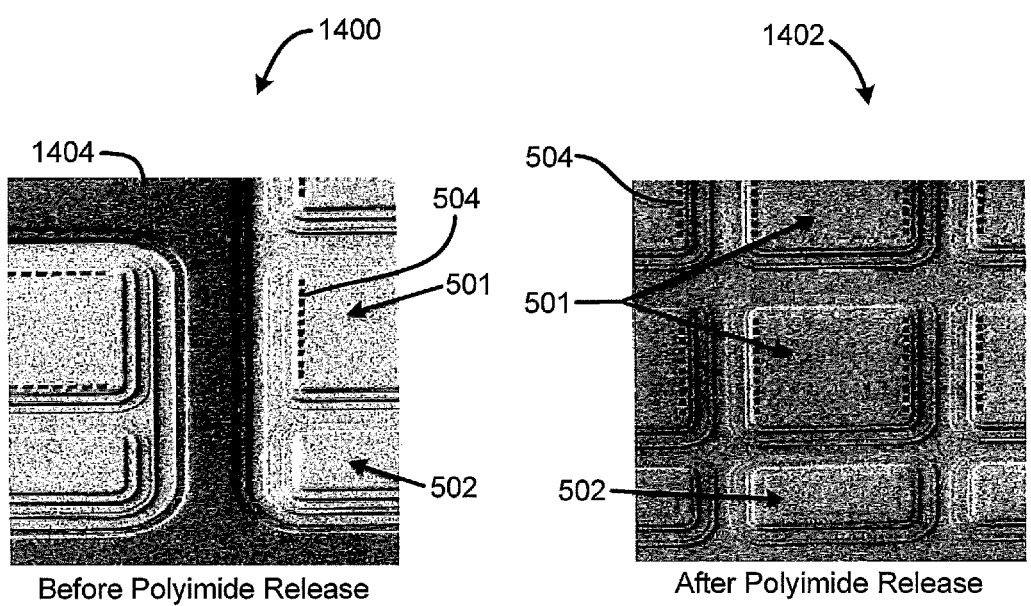
FIG. 14 illustrates perspective views of a device having multiple floating and shunted blinded infrared detectors before and after a release process in accordance with embodiments of the present disclosure.

FIG. 14 illustrates perspective views of a device 1400 having multiple floating blinded infrared detectors 501 with openings 504 and multiple shunted blinded infrared detectors 502 before a release process to remove a sacrificial material 1404 (e.g., polyimide in the example of FIG. 14) and the device 1402 showing the multiple floating blinded infrared detectors 501 with openings 504 and multiple shunted blinded infrared detectors 502 after removal of material 1404 in accordance with embodiments of the present disclosure.

It is understood that this disclosure provides many different embodiments, or examples, for implementing different features of the invention. Specific examples of components and arrangements are described herein. However, these are, of course, merely examples and are not intended to be limiting. Furthermore, various features may be arbitrarily drawn in different scales for the sake of simplicity and clarity.

Embodiments described above illustrate but do not limit the disclosure. It should also be understood that numerous modifications and variations are possible in accordance with the principles of the present disclosure. Accordingly, the scope of the disclosure is defined only by the following claims.

The invention claimed is:

1. A device, comprising:
   a substrate;
   a floating blinded infrared detector comprising:
      a first microbolometer suspended above and thermally isolated from the substrate; and
      a first blocking structure coupled to the substrate, disposed at a distance from the first microbolometer, and configured to block at least a portion of external thermal radiation from being received by the first microbolometer,
   wherein the first blocking structure comprises a staircase structure, and
   wherein the first blocking structure comprises a plurality of openings disposed on one or more treads of the staircase structure; and
   a shunted blinded infrared detector comprising:
      a second microbolometer coupled to the substrate,
      a second blocking structure coupled to the substrate, disposed at a distance from the second microbolometer, and configured to block external thermal radiation from being received by the second microbolometer, and
      a material disposed beneath the second blocking structure that thermally couples the second microbolometer to the substrate and to the second blocking structure.

2. The device of claim 1, further comprising an array of infrared detectors, coupled to and thermally isolated from the substrate, configured to receive external thermal radiation to capture infrared image data.

3. The device of claim 1, further comprising a plurality of the shunted blinded infrared detectors and a plurality of the floating blinded infrared detectors.

4. The device of claim 1, further comprising:
a logic device; and
an array of microbolometers, coupled to and thermally isolated from the substrate, configured to receive external thermal radiation to capture infrared image data, wherein:
the floating blinded infrared detector is configured to provide a detector reference signal;
the shunted blinded infrared detector is configured to provide a substrate reference signal; and
the logic device is configured to perform a temperature correction operation to the infrared image data based on the detector reference signal and the substrate reference signal.

5. The device of claim 1, wherein the floating blinded infrared detector comprises a vacuum cavity separating the first microbolometer and the first blocking structure from the substrate.

6. The device of claim 5, wherein the plurality of openings are configured to allow release materials to pass through the plurality of openings into the vacuum cavity.

7. The device of claim 5, wherein the first microbolometer is thermally isolated from the first blocking structure by the vacuum cavity.

8. The device of claim 1, wherein a size of each one of the plurality of openings is configured to prevent infrared radiation from passing through any one of the plurality of openings.

9. The device of claim 8, wherein the size of each one of the plurality of openings is configured to prevent infrared radiation with wavelengths of less than 14 microns from passing through any one of the plurality of openings.

10. The device of claim 1, wherein the first blocking structure further comprises a plurality of layers.

11. The device of claim 10, wherein the plurality of layers comprises a first insulating layer, a metal layer, and a second insulating layer.

12. The device of claim 1, wherein the substrate comprises a metal layer and a contact coupled to the metal layer, and wherein the first blocking structure is coupled to the contact.

13. The device of claim 1, wherein the substrate comprises a metal layer and a plurality of contacts coupled to the metal layer, and wherein the first blocking structure and the second blocking structure are each coupled to one or more of the plurality of contacts.

14. The device of claim 13, wherein at least one of the plurality of contacts is a basket-shaped contact or a stud contact.

15. A method of generating infrared images, the method comprising:
capturing infrared image data using at least one infrared detector in an array of infrared detectors disposed on a substrate, wherein the array of infrared detectors comprises at least one floating blinded infrared detector and at least one shunted blinded infrared detector, wherein the at least one floating blinded infrared detector comprises a first microbolometer, a first blocking structure configured to block at least a portion of external thermal radiation from being received by the first microbolometer, and a vacuum cavity separating the microbolometer from the substrate, and wherein the at least one shunted blinded infrared detector comprises a second microbolometer, a second blocking structure configured to block at least a portion of external thermal radiation from being received by the second microbolometer, and a material disposed beneath the second blocking structure that thermally couples the second microbolometer to the substrate and to the second blocking structure;
performing a first temperature correction to the infrared image data using detector reference data obtained, at least in part, from the at least one floating blinded infrared detector, wherein the detector reference data specifies a first temperature change due to heating from a current flowing through the first microbolometer; and
performing a second temperature correction to the infrared image data using substrate reference data obtained, at least in part, from the at least one shunted blinded infrared detector, wherein the substrate reference data specifies a second temperature change in the substrate.

16. A method of manufacturing a device, the method comprising:
providing a substrate;
forming a first microbolometer coupled to the substrate;
forming a first blocking structure coupled to the substrate and disposed above the microbolometer to block at least a portion of external infrared radiation from reaching the first microbolometer, wherein the blocking structure comprises a staircase structure and a plurality of openings disposed on one or more treads of the staircase structure;
forming a second microbolometer coupled to the substrate;
forming a second blocking structure coupled to the substrate, disposed above the second microbolometer, and configured to block at least a portion of external infrared radiation from reaching the second microbolometer; and
providing a material disposed beneath the second blocking structure that thermally couples the second microbolometer to the substrate and to the second blocking structure.

17. The method of claim 16, wherein the forming the first blocking structure comprises:
depositing a sacrificial material over the first microbolometer and the substrate;
forming at least one insulating layer over the sacrificial material; and
forming a metal layer over the insulating layer.

18. The method of claim 17, wherein the forming the first blocking structure further comprises forming the plurality of openings in the metal layer.

19. The method of claim 18, further comprising:
removing at least part of the sacrificial material by passing release materials through the plurality of openings; and
creating a vacuum cavity defined, at least in part, by the substrate and the first blocking structure based on the removing of the sacrificial material.

20. The method of claim 16, wherein each one of the plurality of openings has a size that is configured to prevent infrared radiation with wavelengths of less than 14 microns from passing through any one of the plurality of openings.

* * * * *

UNITED STATES PATENT AND TRADEMARK OFFICE
CERTIFICATE OF CORRECTION

PATENT NO. : 10,677,656 B2
APPLICATION NO. : 15/465505
DATED : June 9, 2020
INVENTOR(S) : Eric A. Kurth et al.

It is certified that error appears in the above-identified patent and that said Letters Patent is hereby corrected as shown below:

In the Specification

In the Cross Reference to Related Application:
In Column 1, Line 19, change "U.S. patent application Ser. No. 14/140,747" to --U.S. patent application No. 14/140,747--
In Column 1, Line 24, change "U.S. patent application Ser. No. 14/140,747" to --U.S. patent application No. 14/140,747--
In Column 1, Line 30, change "U.S. patent application Ser. No. 14/140,747" to --U.S. patent application No. 14/140,747--

In Column 3, Line 3, change "block external the external radiation" to --block external thermal radiation--

In Column 6, Line 28, change "U.S. patent application Ser. No. 12/576,971" to --U.S. patent application No. 12/576,971--

Signed and Sealed this
Twenty-ninth Day of December, 2020

Andrei Iancu
*Director of the United States Patent and Trademark Office*